(12) United States Patent
Yang et al.

(10) Patent No.: US 11,367,690 B2
(45) Date of Patent: Jun. 21, 2022

(54) SEMICONDUCTOR DEVICE AND METHOD OF FORMING AN INTEGRATED SIP MODULE WITH EMBEDDED INDUCTOR OR PACKAGE

(71) Applicant: STATS ChipPAC Pte. Ltd., Singapore (SG)

(72) Inventors: DeokKyung Yang, Incheon Si (KR); Woonjae Beak, Incheon (KR); YiSu Park, Incheon Si (KR); OhHan Kim, In-cheon (KR); HunTeak Lee, Gyeongi-dov (KR); HeeSoo Lee, Kyunggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 5 days.

(21) Appl. No.: 16/880,173

(22) Filed: May 21, 2020

(65) Prior Publication Data
US 2020/0286835 A1    Sep. 10, 2020

Related U.S. Application Data

(62) Division of application No. 15/807,833, filed on Nov. 9, 2017, now Pat. No. 10,700,011.
(Continued)

(51) Int. Cl.
*H01L 23/538*      (2006.01)
*H01L 23/31*      (2006.01)
(Continued)

(52) U.S. Cl.
CPC ...... *H01L 23/5389* (2013.01); *H01L 21/4853* (2013.01); *H01L 21/565* (2013.01);
(Continued)

(58) Field of Classification Search
CPC . H01L 23/5389; H01L 23/5386; H01L 24/96; H01L 23/552; H01L 21/4853;
(Continued)

(56) References Cited

U.S. PATENT DOCUMENTS 6,487,083 B1    11/2002    Kwong
6,603,210 B2    8/2003    Kishimoto et al.
(Continued)

FOREIGN PATENT DOCUMENTS

TW    201310544 A    3/2013
TW    201320259 A1    5/2013
(Continued)

*Primary Examiner* — Brigitte A Paterson
*Assistant Examiner* — Lawrence C Tynes, Jr.
(74) *Attorney, Agent, or Firm* — Brian M. Kaufman; Robert D. Atkins; Patent Law Group: Atkins and Associates, P.C.

(57) ABSTRACT

A semiconductor device has a substrate with a first opening and second opening formed in the substrate. A first semiconductor component is disposed on the substrate. The substrate is disposed on a carrier. A second semiconductor component is disposed on the carrier in the first opening of the substrate. A third semiconductor component is disposed in the second opening. The third semiconductor component is a semiconductor package in some embodiments. A first shielding layer may be formed over the semiconductor package. An encapsulant is deposited over the substrate, first semiconductor component, and second semiconductor component. A shielding layer may be formed over the encapsulant.

23 Claims, 12 Drawing Sheets

Related U.S. Application Data

(60) Provisional application No. 62/431,165, filed on Dec. 7, 2016.

(51) Int. Cl.
| | | |
|---|---|---|
| *H01L 23/552* | (2006.01) | |
| *H01L 21/48* | (2006.01) | |
| *H01L 21/56* | (2006.01) | |
| *H01L 23/00* | (2006.01) | |
| *H01L 21/683* | (2006.01) | |
| *H01L 25/16* | (2006.01) | |
| *H01L 23/498* | (2006.01) | |

(52) U.S. Cl.
CPC ........ *H01L 21/568* (2013.01); *H01L 21/6835* (2013.01); *H01L 23/3128* (2013.01); *H01L 23/5386* (2013.01); *H01L 23/552* (2013.01); *H01L 24/96* (2013.01); *H01L 23/49805* (2013.01); *H01L 24/13* (2013.01); *H01L 24/16* (2013.01); *H01L 24/81* (2013.01); *H01L 25/16* (2013.01); *H01L 2221/68331* (2013.01); *H01L 2224/0401* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/16235* (2013.01); *H01L 2224/81201* (2013.01); *H01L 2224/81203* (2013.01); *H01L 2224/81815* (2013.01); *H01L 2224/95001* (2013.01); *H01L 2224/97* (2013.01); *H01L 2924/15311* (2013.01); *H01L 2924/15313* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(58) Field of Classification Search
CPC . H01L 21/565; H01L 23/3128; H01L 21/568; H01L 2224/95001; H01L 2221/68331; H01L 2924/19105; H01L 2224/97; H01L 21/6835; H01L 25/16; H01L 2924/19041; H01L 2924/19043; H01L 2924/19042; H01L 2924/3025; H01L 23/49805; H01L 2224/13116; H01L 2224/13147; H01L 24/13; H01L 2224/13124; H01L 2924/15311; H01L 2224/81815; H01L 2224/16227; H01L 2224/13144; H01L 2224/13139; H01L 2924/15313; H01L 2224/13113; H01L 2224/0401; H01L 2224/81201; H01L 2224/13155; H01L 2224/16235; H01L 24/81; H01L 2224/13111; H01L 24/16
See application file for complete search history.

(56) References Cited

U.S. PATENT DOCUMENTS

| | | | |
|---|---|---|---|
| 6,906,415 | B2 | 6/2005 | Jiang et al. |
| 7,166,917 | B2 | 1/2007 | Yang et al. |
| 7,417,322 | B2 | 8/2008 | Kang |
| 8,872,041 | B2 | 10/2014 | Lee et al. |
| 9,271,436 | B2 | 2/2016 | Chen et al. |
| 9,337,137 | B1 | 5/2016 | Mills |
| 9,437,512 | B2 | 9/2016 | Gregorich et al. |
| 9,466,545 | B1 * | 10/2016 | Scanlan ............... H01L 25/03 |
| 9,653,415 | B2 | 5/2017 | Lee et al. |
| 9,711,492 | B2 | 7/2017 | Albers et al. |
| 9,730,328 | B2 | 8/2017 | Hsu |
| 9,768,124 | B2 | 9/2017 | Scanlan et al. |
| 9,812,387 | B2 | 11/2017 | Tsai et al. |
| 9,997,444 | B2 * | 6/2018 | Meyer ................ H01L 21/565 |
| 2005/0045358 | A1 | 3/2005 | Arnold |
| 2006/0255345 | A1 | 11/2006 | Sakakura et al. |
| 2007/0284717 | A1 | 12/2007 | Lien et al. |
| 2008/0169557 | A1 * | 7/2008 | Tsao ..................... H01L 24/48 257/723 |
| 2010/0244241 | A1 * | 9/2010 | Marimuthu ......... H01L 25/0657 257/737 |
| 2011/0140283 | A1 * | 6/2011 | Chandra ............. H01L 25/0652 257/777 |
| 2011/0298110 | A1 * | 12/2011 | Pagaila ................... H01L 24/19 257/E23.101 |
| 2012/0295397 | A1 | 11/2012 | Koezuka et al. |
| 2013/0001771 | A1 * | 1/2013 | Pagaila ................... H01L 24/96 257/737 |
| 2013/0082399 | A1 | 4/2013 | Kim et al. |
| 2013/0087896 | A1 | 4/2013 | Chou |
| 2015/0084206 | A1 * | 3/2015 | Lin ..................... H01L 23/5389 257/774 |
| 2015/0359096 | A1 | 12/2015 | Hsu et al. |
| 2016/0099210 | A1 | 4/2016 | Kwon et al. |
| 2016/0181193 | A1 | 6/2016 | Hsu et al. |
| 2016/0300799 | A1 * | 10/2016 | Han .................. H01L 23/49838 |
| 2016/0358848 | A1 | 12/2016 | Meyer et al. |
| 2016/0379933 | A1 * | 12/2016 | Scanlan ............... H05K 1/0216 257/659 |
| 2018/0040593 | A1 * | 2/2018 | Zhou ................... H01L 23/5384 |

FOREIGN PATENT DOCUMENTS

| | | | |
|---|---|---|---|
| TW | 201330280 A | 7/2013 | |
| TW | 201624616 A | 7/2016 | |
| WO | WO-2016093808 A1 * | 6/2016 | ............. A01N 25/22 |

\* cited by examiner

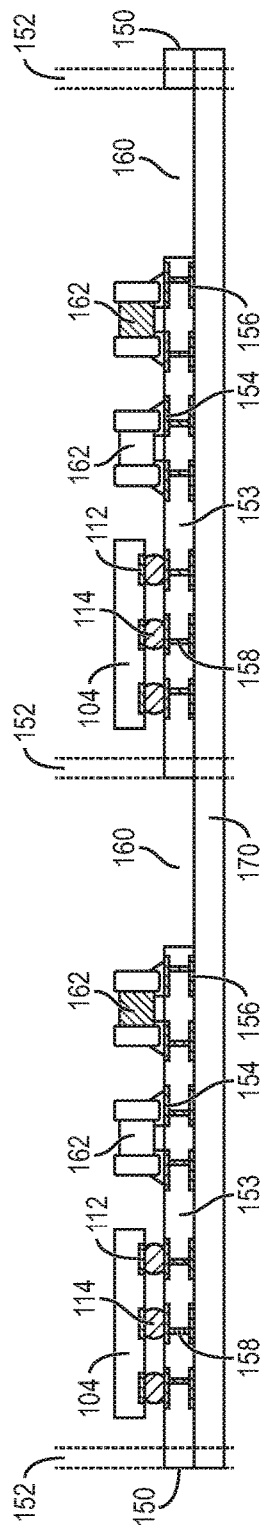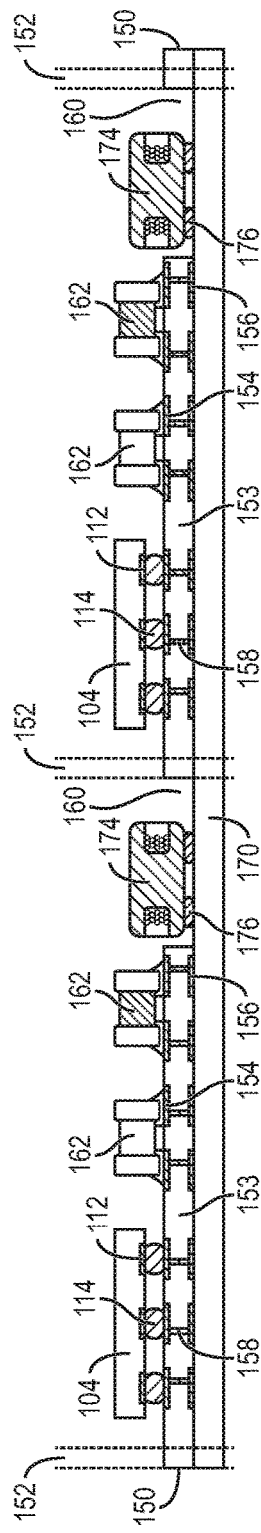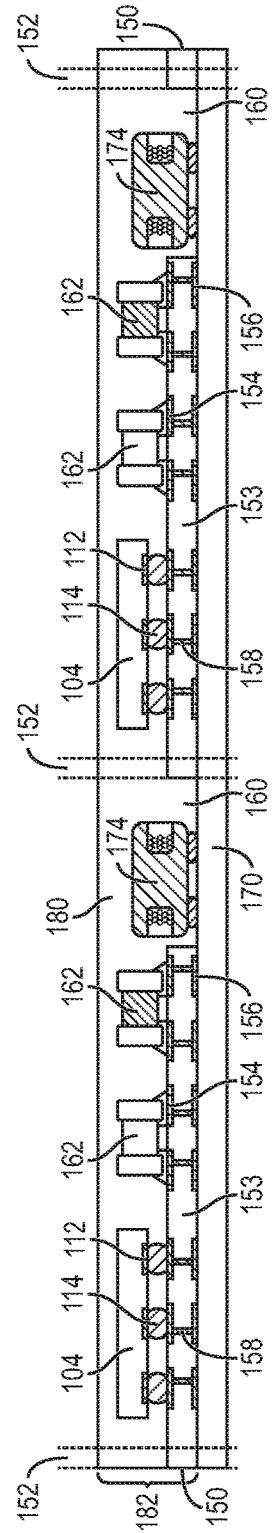

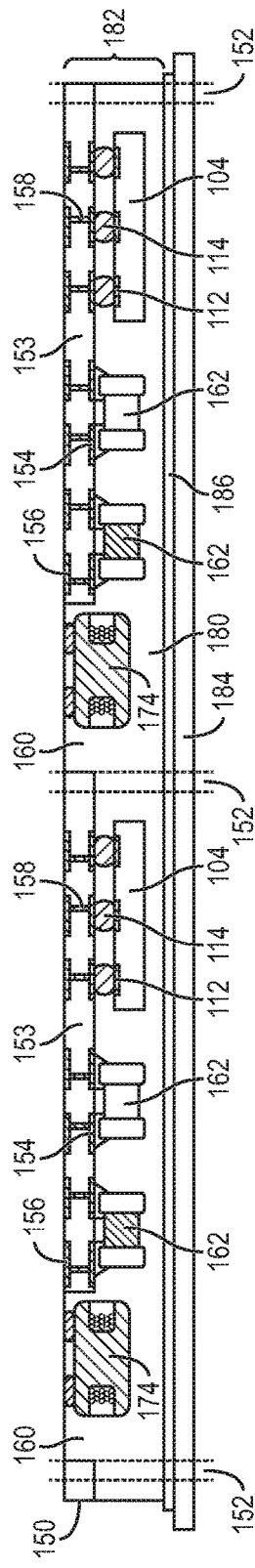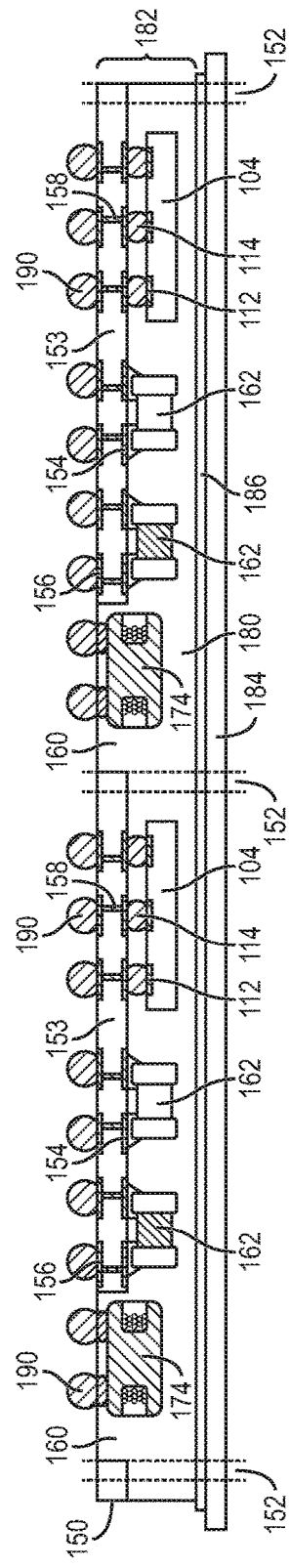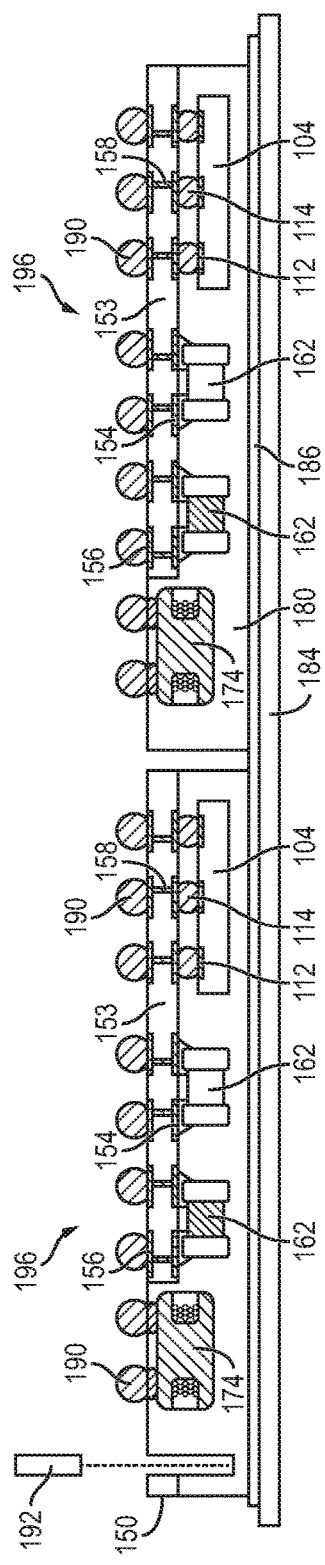

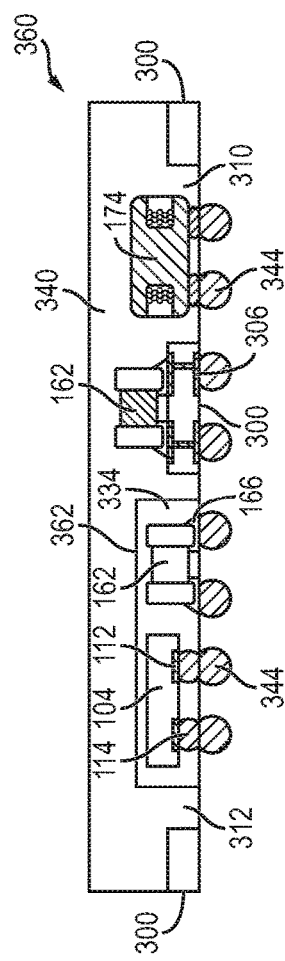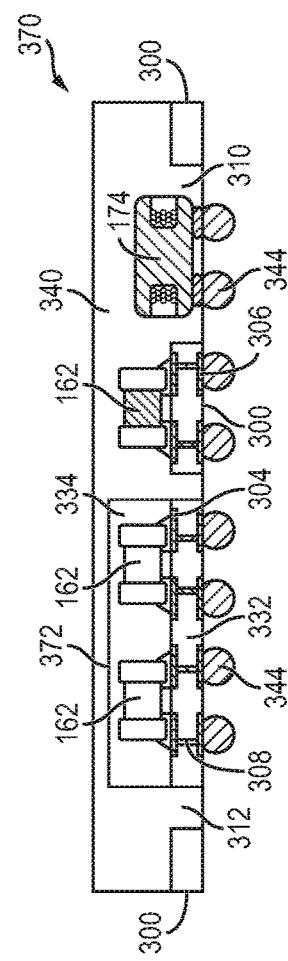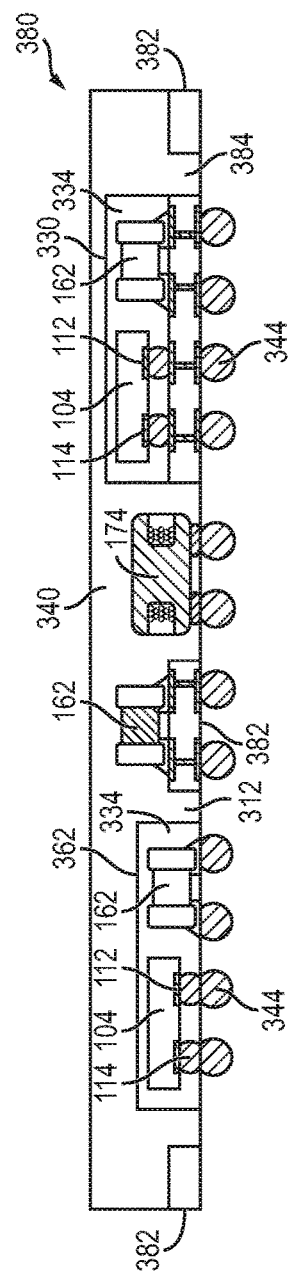
FIG. 8a
FIG. 8b
FIG. 8c

SEMICONDUCTOR DEVICE AND METHOD OF FORMING AN INTEGRATED SIP MODULE WITH EMBEDDED INDUCTOR OR PACKAGE

CLAIM OF DOMESTIC PRIORITY

The present application is a division of U.S. patent application Ser. No. 15/807,833, now U.S. Pat. No. 10,700,011, filed Nov. 9, 2017, which claims the benefit of U.S. Provisional Application No. 62/431,165, filed Dec. 7, 2016, which applications are incorporated herein by reference.

FIELD OF THE INVENTION

The present invention relates in general to semiconductor devices and, more particularly, to a semiconductor device and method of forming integrated system-in-package (SiP) modules with embedded inductors, packages, or both.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photoelectric generation, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor packages are commonly made with several active semiconductor components, discrete passive components, and integrated passive devices (IPDs) packaged together into a single-package system, sometimes known as a system-in-package (SiP) module. SiP modules offer higher density and enhanced electrical functionality relative to traditional semiconductor packaging.

The active and passive components of a SiP module are commonly mounted to a substrate for structural support and electrical interconnect. The substrate and components are encapsulated for environmental protection. The encapsulant at the top surface of the package is generally planarized to make a block shaped package. Because the top surface is flat across the devices, the encapsulant surface must be at least as high as the tallest component within the SiP module. When taller components are used, more encapsulant is required across the entire device, even over shorter components. Encapsulant is wasted over shorter components, and semiconductor devices are made physically larger than necessary. Therefore, a need exists for SiP modules, and methods of forming, having reduced height when taller components are used.

BRIEF DESCRIPTION OF THE DRAWINGS

FIGS. 2a-2i illustrate a process of forming a SiP module with an embedded inductor;

FIGS. 8a-8c illustrate alternative embodiments of the SiP module;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The term "semiconductor die" as used herein refers to both the singular and plural form of the words, and accordingly, can refer to both a single semiconductor device and multiple semiconductor devices. The term "semiconductor component," or simply "component," as used herein refers to active devices formed in semiconductor die, packages formed using semiconductor die, discrete active or passive devices, integrated active or passive circuits, or any other active or passive electrical part.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
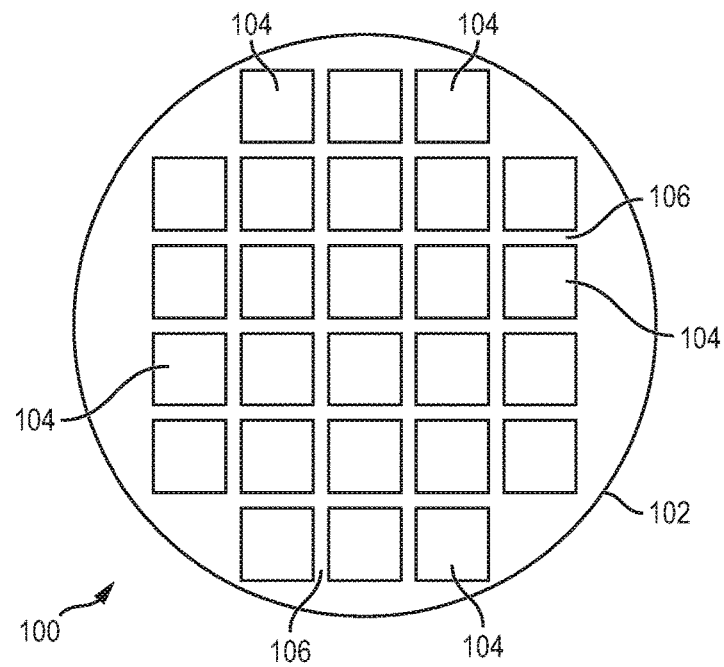
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
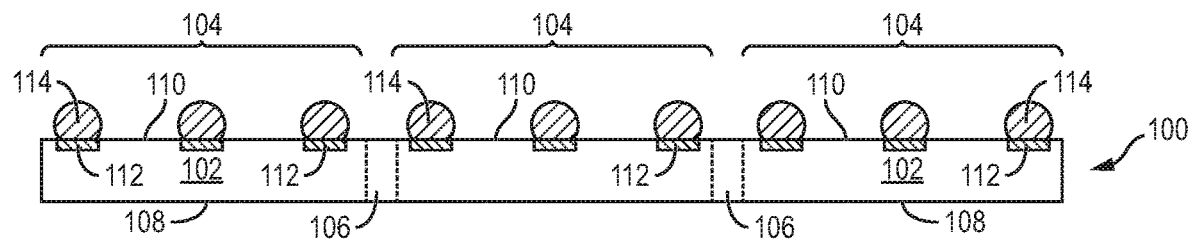

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. The circuits may include one or more transistors, diodes, and other circuit elements formed within active surface 110 to implement analog circuits or digital circuits, such as a digital signal processor (DSP), application specific integrated circuit (ASIC), memory, or other signal processing circuit. Semiconductor die 104 may also contain IPDs, such as inductors, capacitors, and resistors formed in or on interconnect layers over surfaces of the semiconductor die for RF signal processing or other purposes. In some embodiments, semiconductor die 104 include multiple active surfaces with circuits formed therein or thereon each active surface.

An electrically conductive layer 112 is formed over active surface 110 using PVD, CVD, electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits of active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, or a combination thereof, with an optional flux application. For example, the bump material can be eutectic Sn/Pb, high-lead solder, or lead-free solder. The bump material is bonded to conductive layer 112 using a suitable attachment or bonding process. In some embodiments, the bump material is reflowed by heating the material above its melting point to form balls or bumps 114. In one embodiment, bump 114 is formed over an under bump metallization (UBM) having a wetting layer, a barrier layer, and an adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
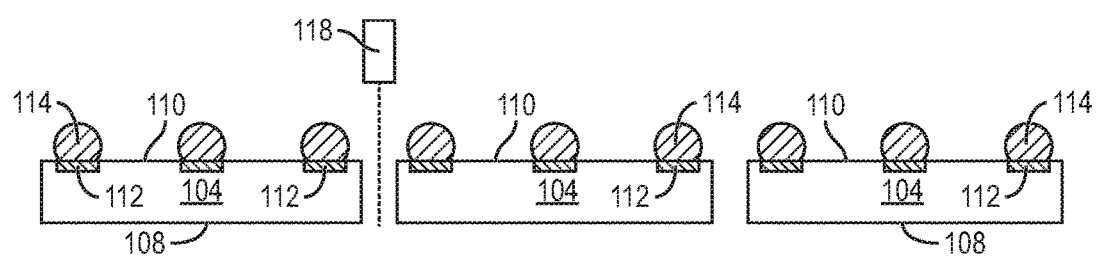

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) before or after singulation.

Figure 2A:
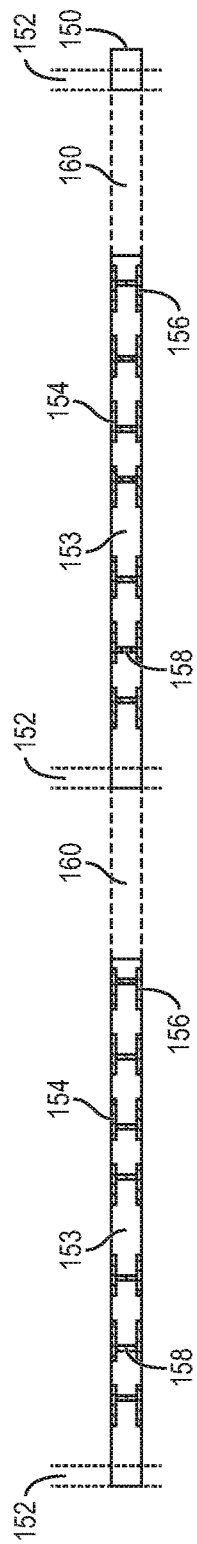

FIGS. 2a-2i illustrate a process of forming SiP modules including semiconductor die 104 and embedded inductors. FIG. 2a shows a cross-sectional view of substrate 150 including a plurality of regions for formation of SiP modules separated by saw streets 152. While only two regions for forming SiP modules are shown, substrate 150 is much larger in other embodiments, with room to form hundreds or thousands of SiP modules in parallel. Substrate 150 is formed from a base insulating material 153 with conductive layers 154 and 156 formed on the two major surfaces of the insulating layer. In one embodiment, insulating material 153 is a molded substrate. In some embodiments, substrate 150 is formed using a plurality of insulating layers 153 interleaved with a plurality of conductive layers, which allows for more complicated signal routing. Portions of conductive layers 154 and 156 are electrically common or electrically isolated depending on the design and function of the SiP module being formed.

Conductive layers 154 and 156 can be one or more layers of Al, Cu, Sn, Ni, Au, Ag, or other suitable electrically conductive material. Conductive vias 158 extend through insulating layer 153 to electrically connect portions of conductive layer 154 to portions of conductive layer 156. Conductive layers 154 and 156 provide horizontal electrical interconnect across substrate 150, while conductive vias 158 provide vertical electrical interconnect through substrate 150. In one embodiment, conductive vias 158 are formed by providing an opening through insulating layer 153 by etching, drilling, laser ablation, or another suitable process, and then depositing or plating conductive material into the opening. In some embodiments, conductive material for conductive vias 158 is deposited into openings of insulating layer 153 as part of forming conductive layers 154 or 156.

Substrate 150 can also be any suitable laminate interposer, PCB, wafer-form, strip interposer, leadframe, embedded trace substrate (ETS), or other type of substrate. Substrate 150 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating layer 153 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazole (PBO), and other material having similar insulating and structural properties. Substrate 150 can also be a multilayer flexible laminate, ceramic, copper clad laminate, glass, or semiconductor wafer including an active surface containing one or more transistors, diodes, and other circuit elements to implement analog or digital circuits.

Substrate 150 includes holes or openings 160 at locations where inductors, or other taller components, are to be disposed within the footprint of the SiP modules. Openings 160 are formed through substrate 150 using a saw blade, laser cutting tool, water cutting tool, an etching process, or another suitable mechanism for forming an opening through a substrate. In other embodiments, substrate 150 is formed in a manner that leaves openings 160 through the substrate without having to separately form an opening after the substrate is manufactured.

Figure 2B:
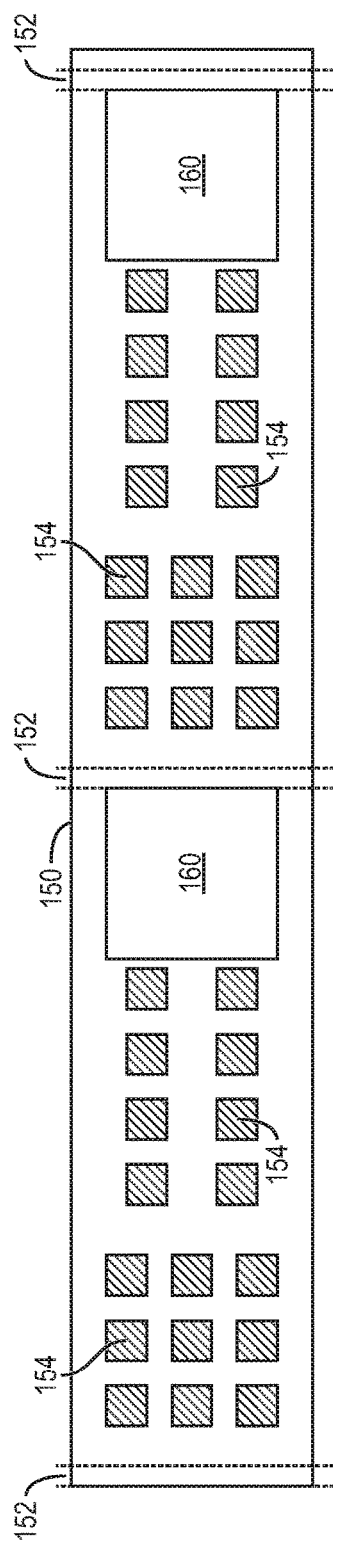

FIG. 2b illustrates a plan view of substrate 150 from the top of FIG. 2a. Conductive layer 154 includes a plurality of contact pads for surface mounting semiconductor die and discrete components as desired to implement a given electrical function. Conductive layer 154 can include any desired number, shape, and layout of contact pads. In some embodiments, conductive layers 154 and 156 also include conductive traces to electrically connect a plurality of contact pads to each other. Openings 160 are formed through substrate 150 in locations where taller components are to be placed. Substrate 150 can be tested at the current stage seen in FIGS. 2a and 2b, prior to mounting semiconductor die and other components on the substrate.

Figure 2C:
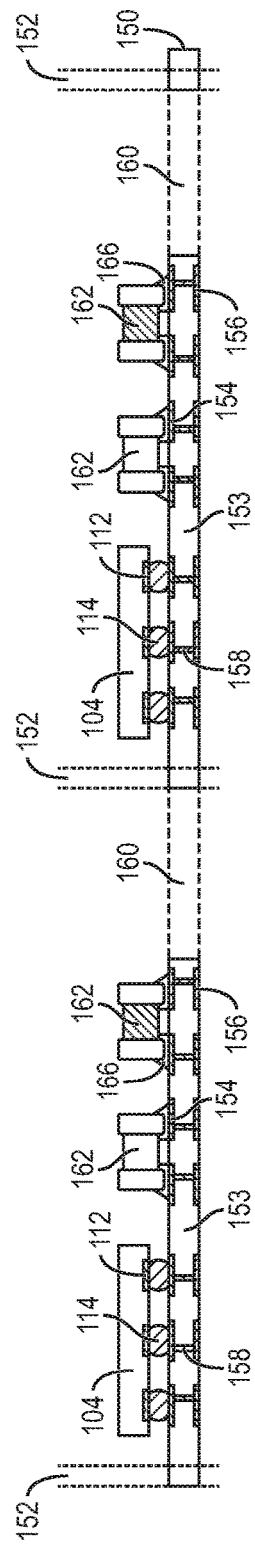

In FIG. 2c, semiconductor die 104 and discrete devices 162 are surface mounted onto conductive layer 154. In some embodiments, substrate 150 is disposed on a carrier for installation of semiconductor die 104 and discrete devices 162. Semiconductor die 104 can be tested for KGD prior to mounting onto substrate 150 to avoid using bad die on good substrate device regions. In addition, the regions of substrate 150 can be tested prior to mounting components, and regions of the substrate with manufacturing defects can be discarded without wasting KGD on a bad substrate. In some embodiments, bad or blank semiconductor die 104 are disposed on bad regions of substrate 150 to keep weight distribution even across the substrate and help control warpage.

FIG. 2c shows each device region of substrate 150 having two discrete devices 162, which can be inductors, capacitors, resistors, or other passive circuit components. Discrete devices 162 can also be devices with active functionality, e.g., power transistors, transient voltage suppression diodes, etc. In other embodiments, any combination of active and passive devices can be provided on substrate 150 as desired to implement the intended functionality of a final SiP module. In one embodiment, discrete devices 162 implement a band-pass filter or another radio frequency (RF) signal processing network. In another embodiment, discrete devices 162 filter a power signal to semiconductor die 104. Discrete devices 162 can implement any desired electrical function. Discrete devices 162 operate in conjunction with a component disposed within opening 160 in some embodiments.

Discrete devices 162 are mechanically bonded and electrically connected to conductive layer 154 through solder or solder paste 166. In one embodiment, solder paste 166 is printed onto substrate 150, reflowed with discrete devices 162 in physical contact, and then defluxed. Semiconductor die 104 are mechanically bonded and electrically connected to conductive layer 154 through conductive bumps 114. In some embodiments, bumps 114 and solder paste 166 are reflowed at the same time to surface mount all components in a single step.

In FIG. 2d, a tape 170 is laminated on the bottom surface of substrate 150, opposite semiconductor die 104 and discrete devices 162. Tape 170 may include an adhesive material to hold components in place. Tape 170 extends across opening 160 to support components disposed within the opening. Tape 170 operates as a carrier to form SiP submodules with substrate 150. In some embodiments, substrate 150 with tape 170 is disposed on another carrier for further processing. In other embodiments, another type of carrier with an adhesive interface layer is used instead of tape 170.

In FIG. 2e, discrete devices 174 are disposed on tape 170 within openings 160 of substrate 150. Discrete devices 174 are taller than semiconductor die 104 and discrete devices 162. Discrete devices 174 are disposed within openings 160, rather than on substrate 150 as with discrete devices 162, to lower the height of discrete devices 174 within the final package. Discrete devices 174 are illustrated as inductors because inductors are commonly the tallest components in SiP modules. However, other components besides inductors are disposed in opening 160 to lower the height of any component as desired. In some embodiments, multiple taller discrete devices are disposed within a single opening 160 of each SiP module. In one embodiment, each SiP module includes a plurality of openings 160 formed through substrate 150.

Discrete devices 174 include interconnect structures 176 on the discrete devices. Discrete devices 174 are disposed in openings 160 with interconnect structures 176 in contact with tape 170. When tape 170 is subsequently removed, interconnect structures 176 are exposed, along with the contact pads of conductive layer 156, for subsequent electrical interconnect. Interconnect structures 176 are contact pads similar to conductive layer 156 in one embodiment. In another embodiment, interconnect structures 176 are solder bumps similar to bumps 114 or solder paste similar to solder paste 166.

In FIG. 2f, an encapsulant or molding compound 180 is deposited over substrate 150, semiconductor die 104, and discrete devices 162 and 174 using a paste printing, compressive molding, transfer molding, liquid encapsulant molding, vacuum lamination, spin coating, or other suitable applicator. Encapsulant 180 can be polymer composite material, such as epoxy resin, epoxy acrylate, or polymer with or without filler. Encapsulant 180 is non-conductive, provides structural support, and environmentally protects the semiconductor device from external elements and contaminants. Encapsulant 180 flows below semiconductor die 104 between conductive bumps 114, below discrete devices 162 between solder paste 166, and below discrete devices 174 between interconnect structures 176 to completely fill the space between substrate 150 and the semiconductor die and discrete devices. In other embodiments, a separate underfill is used for some or all components.

Substrate 150 covered with encapsulant 180 forms a panel 182. Having the taller discrete device 174 within an opening 160 of substrate 150 lowers the height of the tallest components in panel 182, thus reducing the minimum thickness of encapsulant 180 required to cover all components. In some embodiments, encapsulant 180 is deposited thicker than necessary and backgrinded to reduce a thickness of panel 182. Backgrinding is performed using chemical mechanical planarization (CMP), an etching process, laser direct ablation (LDA), or another suitable thinning procedure.

In FIG. 2g, panel 182 is flipped and disposed on carrier 184 with substrate 150 oriented away from the carrier. An interface layer or double-sided tape 186 is formed over carrier 184 as a temporary adhesive bonding film, etch-stop layer, or thermal release layer. Tape 170 is removed using a thermal release, ultraviolet release, mechanical peeling, or other removal process suitable for the type of tape used.

In FIG. 2h, conductive bumps 190 are formed on panel 182 over conductive layer 156 and interconnect structures 176. Bumps 190 are similar to bumps 114 on semiconductor die 104, and can be solder bumps, stud bumps, conductive pillars, or another suitable interconnect structure. Bumps 190 can be reflowed or compression bonded onto conductive layer 156. In embodiments where interconnect structures 176 include solder bumps, interconnect structures 176 can be reflowed together with corresponding bumps 190 to form a single continuous body of solder.

In FIG. 2i, panel 182 is singulated through substrate 150 and encapsulant 180 at saw streets 152 using saw blade, laser cutting tool, or water cutting tool 192, into a plurality of SiP modules 196. In some embodiments, panel 182 is singulated through opening 160.

Figure 3:
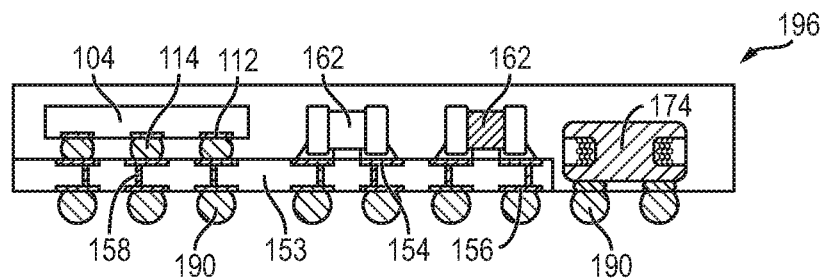
FIG. 3 illustrates the SiP module with an embedded inductor.

FIG. 3 illustrates a completed SiP module 196 removed from carrier 184 using thermal release, UV release, mechanical detachment, or another appropriate means.

Bumps 190 are configured to be coupled to a PCB or other substrate of an electronic device to integrate the functionality of SiP module 196 into the electronic device. Semiconductor die 104 and discrete devices 162 are electrically coupled to the underlying PCB through conductive layer 154, conductive vias 158, conductive layer 156, and conductive bumps 190. In some embodiments, semiconductor die 104 is coupled to discrete devices 162 through conductive layer 154 or 156. SiP module 196 provides a plurality of components, each usable by the larger electronic device, in a single easy to integrate package.

Discrete device 174 is a relatively tall component. Discrete device 174 is disposed within opening 160 of substrate 150 to reduce the overall height of SiP module 196. Removing substrate 150 under discrete device 174 allows the taller component to sit on a lower plane than discrete devices 162. The top of the tallest components in SiP module 196, and thus the overall top surface of the SiP module, is therefore lower than if discrete device 174 was disposed on substrate 150.

In some embodiments, the height of encapsulant 180 over substrate 150 is less than the height of discrete device 174, such that discrete device 174 would not fit within the encapsulant if the discrete device were disposed on the substrate and the encapsulant height remained the same. Discrete device 174 is placed within a height of substrate 150, that is, a portion of the vertical extent of discrete device 174 is located vertically between the top and bottom surfaces of substrate 150. Discrete device 174 occupies the same vertical space as substrate 150 because discrete device 174 is not within the footprint of substrate 150. Rather, discrete device 174 is adjacent to or within an opening of substrate 150.

Adding opening 160 through substrate 150 results in a SiP module with the same components, but with a reduced size, relative to a device with all components on the substrate. The package height is reduced because the taller inductors are attached at the bottom of the package, rather than on the substrate. Electronic devices incorporating SiP module 196 can be made smaller, an important consideration in today's electronic device market. In addition, placing the inductor in opening 160 rather than on substrate 150 detaches the inductor from the other components and improves reliability of the inductor.

Figure 4A:
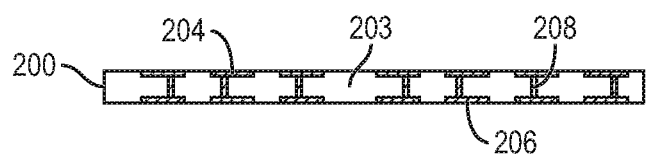
FIGS. 4a-4d illustrate forming the SiP module using PCB units.
Figure 4B:
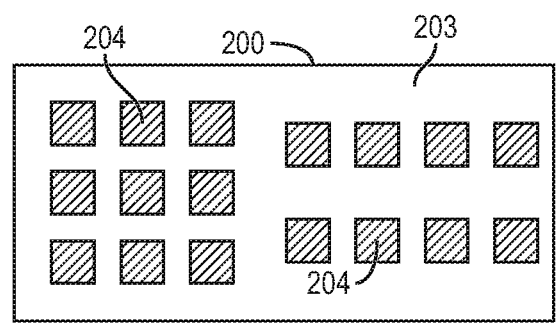

FIGS. 4a-4d illustrate forming SiP modules with individual PCB units 200 for each SiP module rather than a strip substrate 150 common among all SiP modules formed together. FIG. 4a illustrates a single PCB unit 200 in cross-section, while FIG. 4b illustrates a plan view. PCB unit 200 is similar to substrate 150, but cut to the size necessary for a single SiP module. In some embodiments, PCB units 200 are formed in the exact same manner as substrate 150 above, but singulated into individual PCB units rather than having openings 160 formed through the substrate.

Figure 4C:
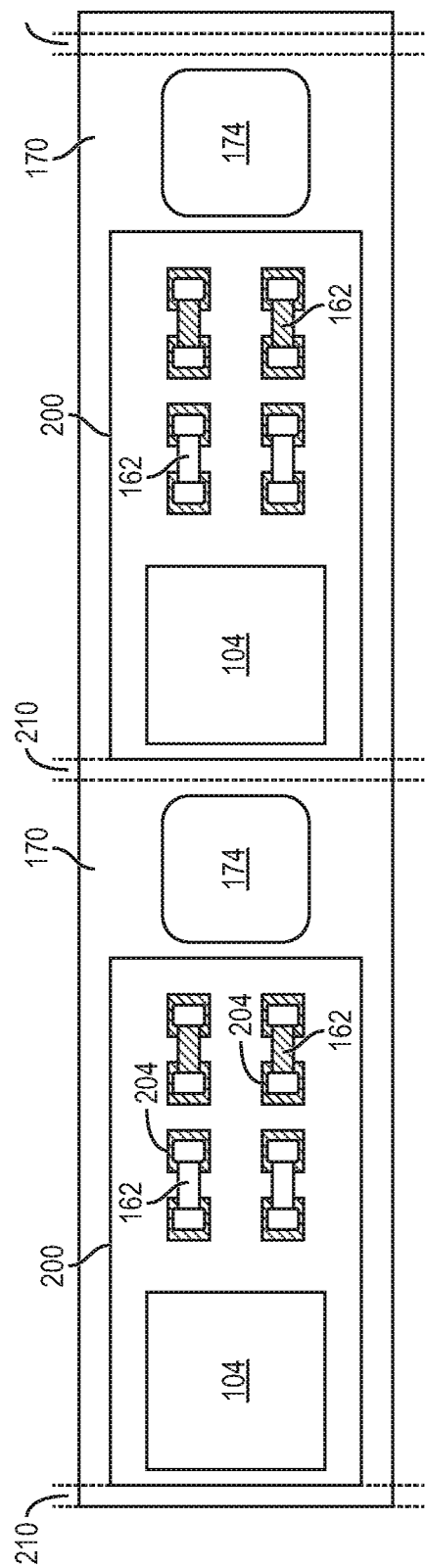
Figure 4D:
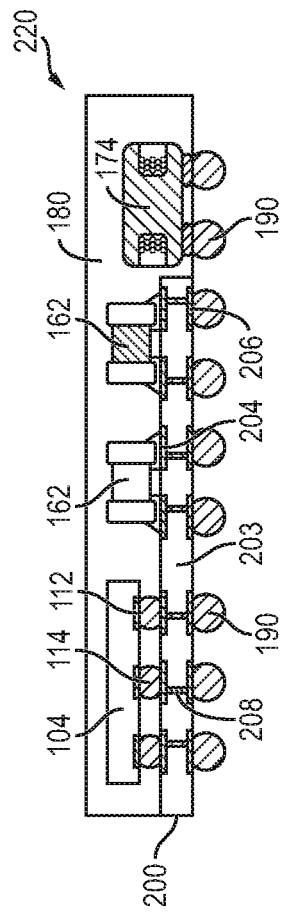

FIG. 4c illustrates a plan view of semiconductor die 104 and discrete devices 162 mounted onto PCB units 200. PCB units 200 and discrete devices 174 are disposed on tape 170. FIG. 4c illustrates the manufacturing process in a similar state to FIG. 2e, but with a separate PCB unit 200 for each SiP module. The units are encapsulated, singulated, and bumped as discussed above to form a SiP module 220 in FIG. 4d. SiP module 220 is similar to SiP module 196, providing a similar benefit to device height by placing the taller discrete device 174 outside the footprint of PCB unit 200.

Figure 5A:
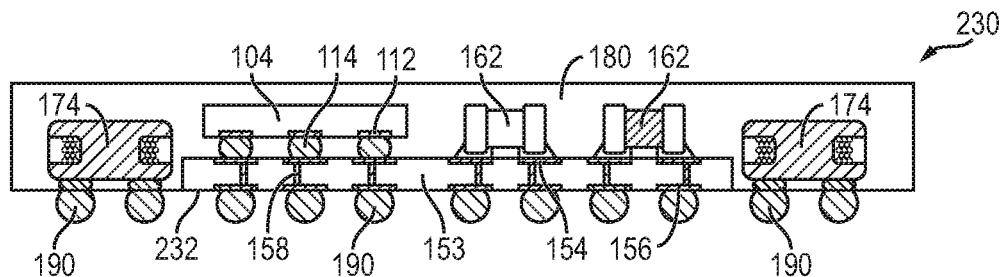
FIGS. 5a-5d illustrate alternative embodiments of the SiP module.

FIG. 5a illustrates SiP module 230 formed with substrate 232. Substrate 232 is similar to substrate 150, but includes two openings 160 per device. Two openings 160 allows two separately located discrete devices 174 to be used outside of the substrate footprint. While FIG. 5a illustrates the two openings 160 on the edges of the device, openings 160 are more centrally located within the SiP modules in other embodiments.

Figure 5B:
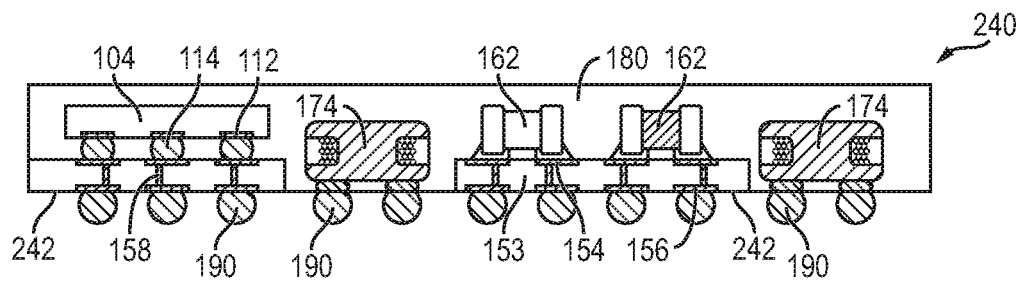

FIG. 5b illustrates SiP module 240 with substrate 242. Substrate 242 includes opening 160 with discrete device 174 between semiconductor die 104 and discrete devices 162. In another embodiment, multiple discrete devices 174 are disposed within a single, larger, opening. A PCB unit, similar to PCB unit 200, is used in one embodiment, rather than a strip substrate with openings. Any appropriate number and position of discrete devices 174 is contemplated.

Figure 5C:
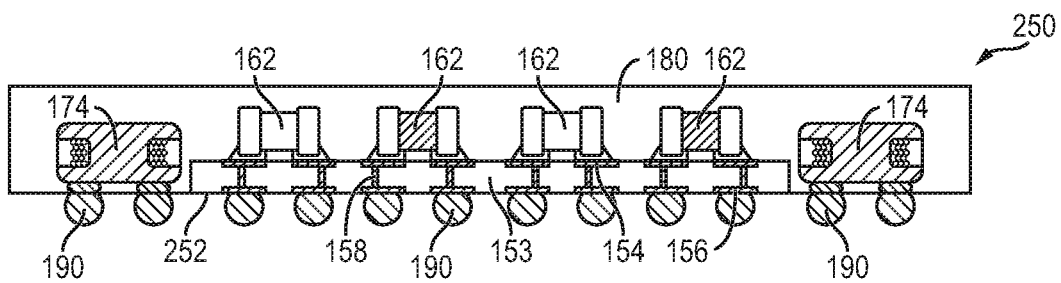

FIG. 5c illustrates SiP module 250 with substrate 252. Substrate 252 is configured to have all mounted components be discrete devices 162 that are passive, and no active devices. SiP module 250 has no active functionality, but only provides a set of desired passive components for integration into a larger system. Disposing taller discrete devices 174 within openings 160 reduces the overall package height of SiP module 250.

Figure 5D:
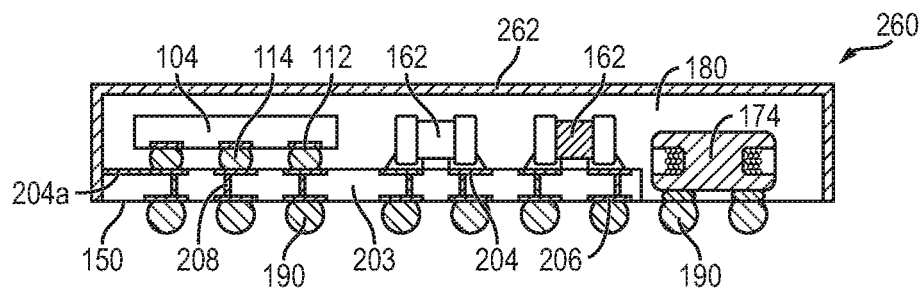

FIG. 5d illustrates SiP module 260 with shielding layer 262 formed over the package. SiP module 260 is similar to SiP module 196, but formed with a process that allows shielding layer 262 to be plated over the packages. In one embodiment, panel 182 is flipped and transferred to another carrier after singulation in FIG. 2i, and shielding layer 262 is sputtered over the singulated packages. Shielding layer 262 is optionally electrically coupled to a ground node of an underlying substrate through a portion 204a of conductive layer 204 that is routed to the edge of substrate 150 to contact the shielding layer. Shielding layer 262 may also be coupled to a ground node through conductive layer 206. Shielding layer 262 can be connected to a ground line of a substrate within SiP module 260, a semiconductor package embedded within the SiP module, or an underlying substrate of a larger electronic device.

Figure 6A:
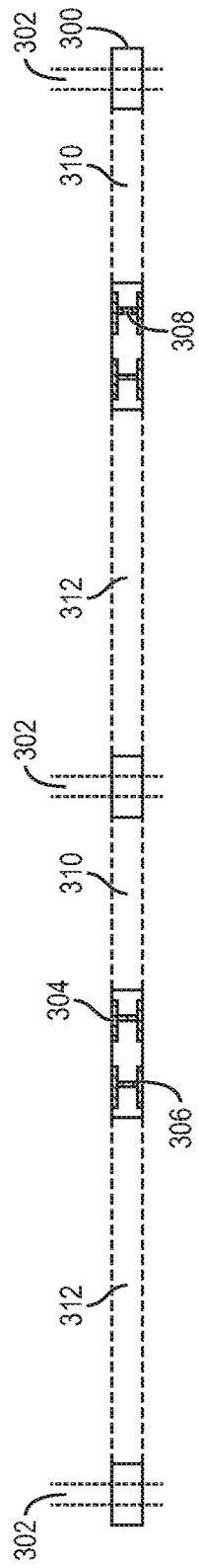
FIGS. 6a-6d illustrate a process of forming a SiP module with both an embedded inductor and an embedded semiconductor package.
Figure 6B:
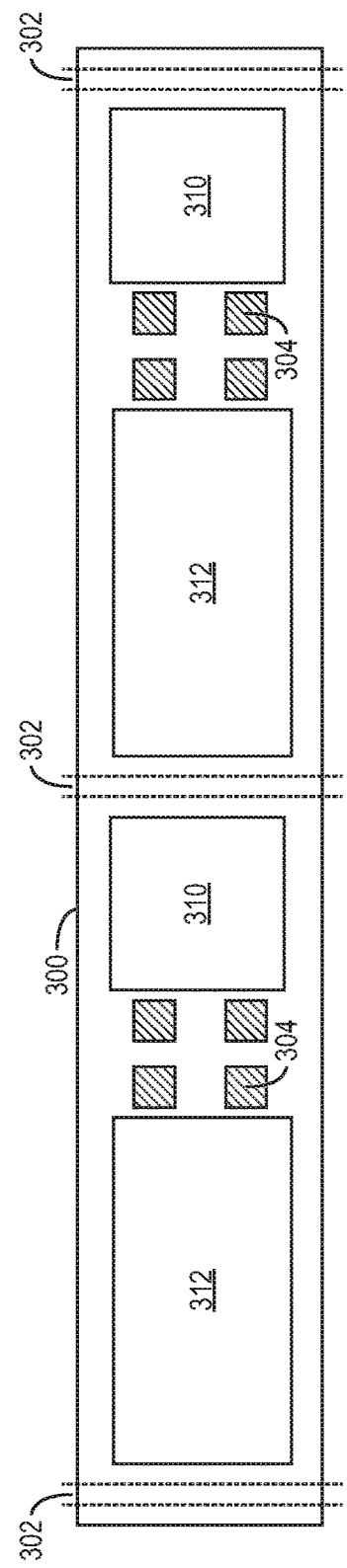

FIGS. 6a-6d illustrate forming a SiP module with an embedded inductor and also an embedded subpackage. FIG. 6a shows a cross section of substrate 300 with saw streets 302, while FIG. 6b illustrates a plan view. Substrate 300 is substantially similar to substrate 150 above. Conductive layer 304 and conductive layer 306 are electrically coupled to each other through conductive vias 308, similar to conductive layers 154 and 156, and vias 158. Substrate 300 includes a pair of openings 310 and 312 formed through the substrate, which are each similar to opening 160 above. In some embodiments, a separate PCB unit is used for each device rather than a larger substrate 300 for an entire sheet of devices.

Opening 310 through substrate 300 is a similar size to opening 160 to accommodate a similar inductor or other discrete device 174. Opening 310 is configured to fit a subpackage to be incorporated into the SiP module. In the illustrated embodiment, opening 312 is larger than opening 310. The openings can be any relative size to accommodate the specific parts selected for a SiP module, or a single opening can be used for multiple components.

Figure 6C:
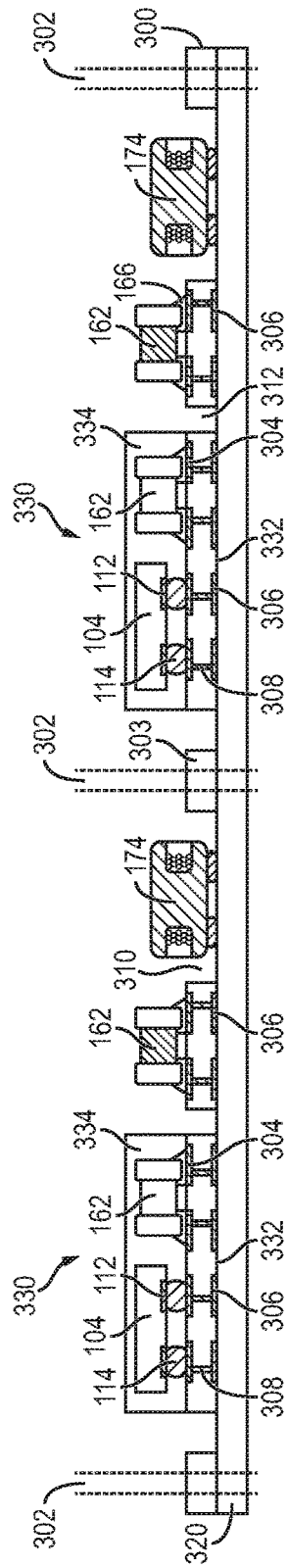

In FIG. 6c, substrate 300 is disposed on tape 320, which is similar to tape 170 above. Discrete device 162 is mounted onto conductive layer 304, as above with conductive layer 154. Discrete device 174 is mounted in opening 310 as above with opening 160. A semiconductor package 330 is disposed on tape 320 within opening 312. Semiconductor package 330 includes any desirable combination of electrical components, e.g., semiconductor die 104 and discrete devices 162, disposed on a substrate 332. To manufacture package 330, substrate 332 is usually provided as a sheet that has components disposed thereon for a plurality of packages 330, which are then molded with encapsulant 334 and singulated into individual packages.

Semiconductor package 330 can be manufactured in advance and tested to be a known good package separately from the SiP module as a whole. In some embodiments, semiconductor package 330 includes a system with functionality to be incorporated into the SiP module, e.g., an RF module, display module, or other useful module.

In other embodiments, other package types are incorporated into a SiP module by being disposed in opening 312. Substrate 332 can be replaced by another type of substrate, e.g., a semiconductor substrate, multi-layer substrate, or a leadframe. Components of package 330 can be coupled to the substrate by solder bumps, stud bumps, solder paste, bond wires, or other appropriate interconnect structure. Some embodiments of package 330 do not use a substrate, e.g., as illustrated below in FIG. 8a. Any suitable semiconductor package can be disposed within an appropriately sized opening 312 for incorporation into the SiP module.

Figure 6D:
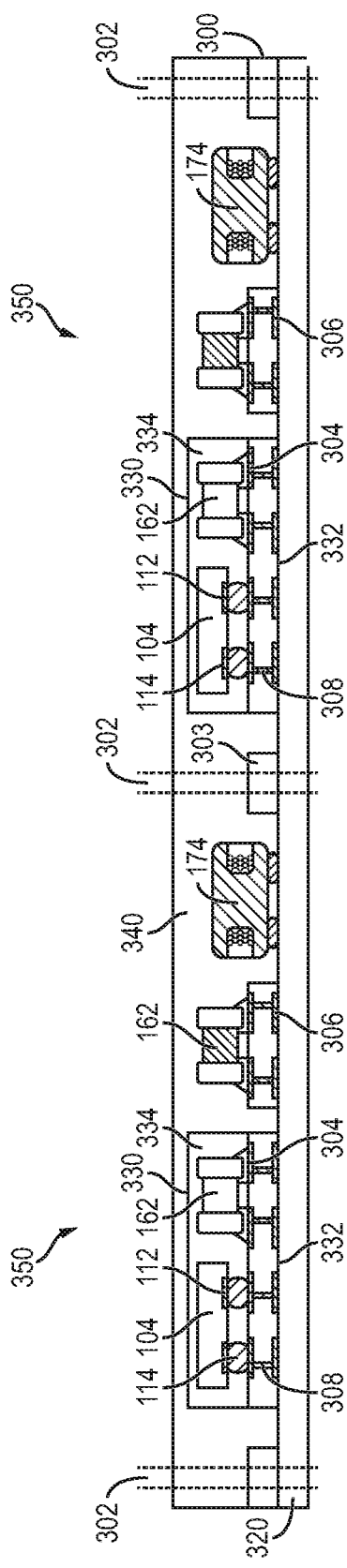

In FIG. 6d, encapsulant 340 is deposited over packages 330, discrete devices 162, and discrete devices 174. Encapsulant 340 is similar to encapsulant 180 above, and deposited similarly. Tape 320 is removed, bumps 344 are added, and a plurality of individual SiP modules 350 is produced by cutting through saw streets 302 using a saw blade, laser cutting tool, water cutting tool, or other appropriate means. Both substrate 332 and substrate 300 include similar conductive layers 306 with contact pads exposed for bumping. The conductive layers 306 of substrates 332 and 300 are substantially coplanar because both were disposed in contact with tape 320 for encapsulation. One bumping process applies bumps to both substrates 332 and 300. Bumps 344 are one possible interconnect structure that can be used. In other embodiments, stud bumps, copper pillars, or other suitable interconnect structures are used.

Figure 7:
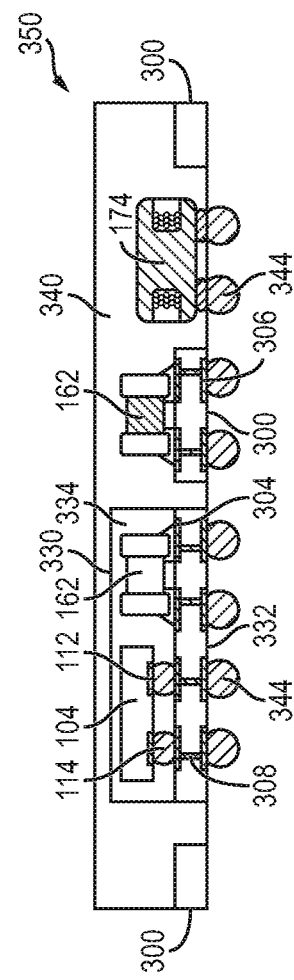
FIG. 7 illustrates the SiP module with both an embedded inductor and an embedded semiconductor package.

FIG. 7 illustrates a singulated SiP module 350. SiP module 350 includes an embedded semiconductor package 330 and discrete device 174 within openings of substrate 300. The height of SiP module 350 is reduced by placing the taller components 330 and 174 within openings of substrate 300, rather than on the substrate. Package 330 and discrete device 174 have heights that are greater than the height of discrete device 162. Placing package 330 and discrete device 174 within openings of substrate 300 lowers the tops of those components to allow an overall thinner package. Embedding some functionality as a subpackage increases design flexibility by allowing various functional die or modules to be applied. Having separate subpackaged modules also allows the modules to be tested before incorporation into SiP module 350. In some embodiments, a subpackage is used in a SiP module without also having discrete device 174 embedded in the substrate.

FIGS. 8a-8c illustrate alternative configurations for SiP modules with embedded packages. In FIG. 8a, SiP module 360 has package 330 replaced by package 362. Package 362 is a package formed by embedding components in encapsulant 334 without a substrate. Interconnect structures on the components, e.g., bumps 114 and solder paste 166, remain exposed from encapsulant 334 for attachment of bumps 344. In one embodiment, components are picked and placed on an adhesive tape to keep the components in place for encapsulation. Interconnect structures on the components are in contact with the tape during molding, such that removing the tape exposes the interconnect structures. Encapsulant 340 and substrate 300 are singulated to create individual packages 362 for incorporation into SiP module 360.

FIG. 8b illustrates SiP module 370 with only passive components. Package 370 includes only passive discrete devices 162, e.g., inductors, capacitors, and resistors. The components of package 370 can perform a specific function, e.g., a band pass filter. The components can be discrete passive devices or integrated passive devices formed using metal layers on or in substrate 332. Any type of subpackage discussed above or below can be used with only passive devices, only active devices, or with a combination of active and passive devices.

FIG. 8c illustrates SiP module 380 with a plurality of embedded packages within openings of substrate 382. Package 362 is disposed in opening 310 as in FIG. 8a. Package 330 is disposed in an enlarged opening 384 along with discrete device 174. The number, location, type, and function of embedded packages is not limited to the disclosed embodiments, and can be configured differently as desired.

Figure 9A:
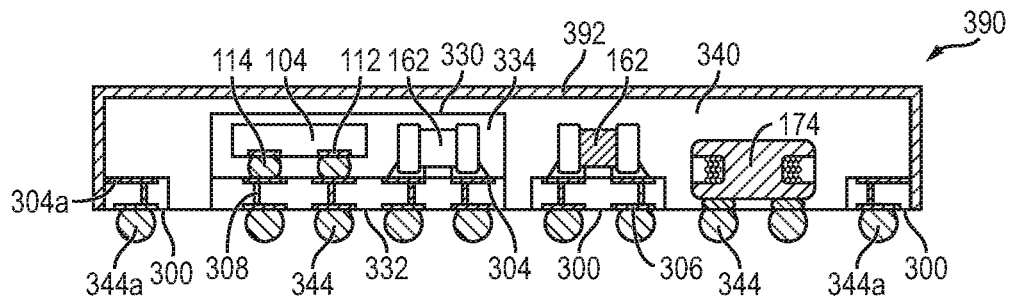
FIGS. 9a-9c illustrate electromagnetic interference (EMI) shielding options for the SiP module.
Figure 9B:
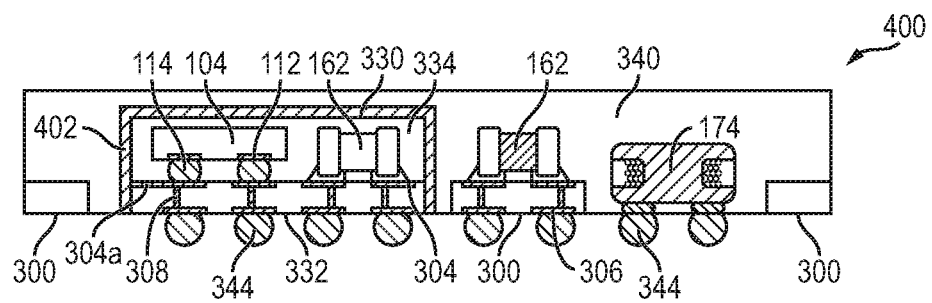
Figure 9C:
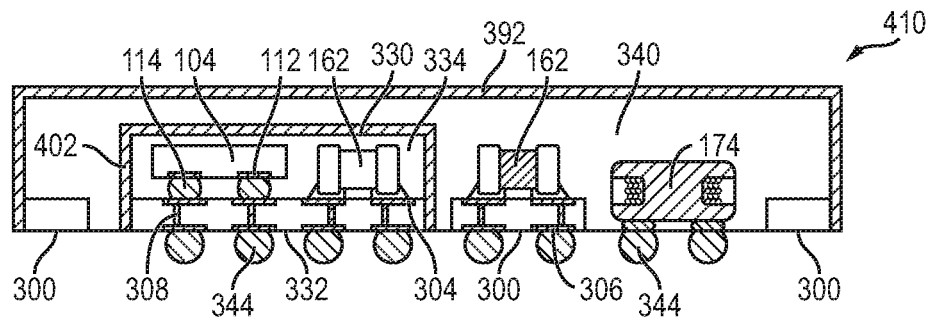

FIGS. 9a-9c illustrate shielding options for the SiP modules with embedded packages. In FIG. 9a, SiP module 390 includes a shielding layer 392 applied in a similar manner to shielding layer 262 above. Shielding layer 392 is sputtered or plated over the entire SiP module 390. Shielding layer 392 is optionally coupled to a ground node of an underlying substrate through conductive layer 304a, or a portion of conductive layer 306, and conductive bump 344a. Shielding layer 392 is coupled to a grounding node of substrate 332 in other embodiments.

FIG. 9b illustrates SiP module 400 with shielding layer 402 formed over subpackage 330. Shielding layer 402 is applied in a similar manner to shielding layers 262 and 292, but at the subpackage level. Shielding layer 402 is optionally coupled to a ground node through conductive layer 304a. In devices with multiple subpackages, each of the subpackages can include a shielding layer, or only a portion of the subpackages may have shielding. FIG. 9c illustrates an embodiment with both shielding layer 392 at the SiP module level and shielding layer 402 at the subpackage level. Conductive layers 304 or 306 in substrate 332 or 300 couple shielding layers 392 or 402 to a ground node in some embodiments.

Figure 10A:
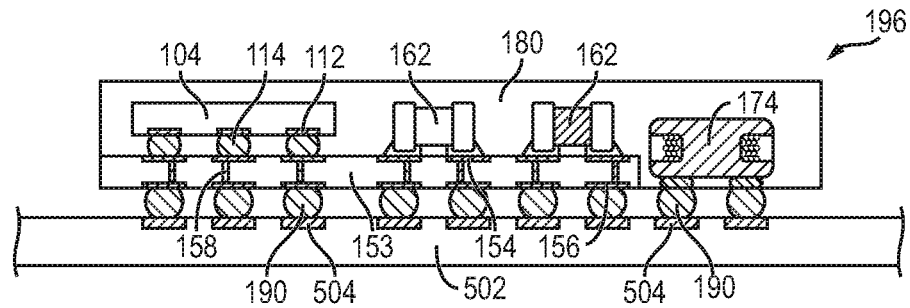
FIGS. 10a-10b illustrate a printed circuit board (PCB) with a SiP module mounted to a surface of the PCB.
Figure 10B:
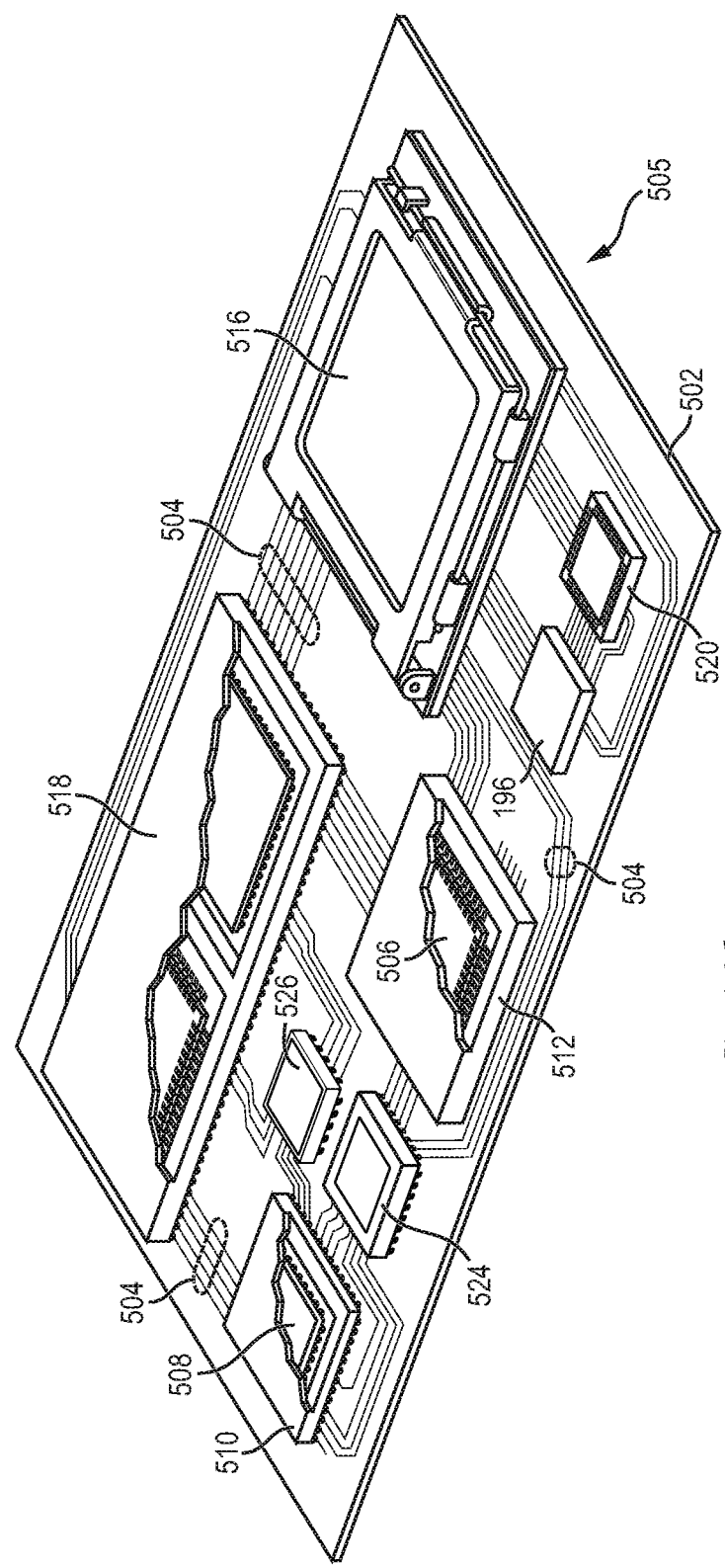

FIGS. 10a-10b illustrate incorporating the above described SiP modules into an electronic device. FIG. 10a illustrates a partial cross-section of SiP module 196 from FIG. 3 mounted onto a PCB or other substrate 502 as part of an electronic device. Bumps 190 are reflowed onto conductive layer 504 to physically attach and electrically connect SiP module 196 to PCB 502. Any of the above described SiP modules can similarly be mounted onto PCB 502. In other embodiments, thermocompression or other suitable attachment and connection methods are used. In some embodiments, an adhesive or underfill layer is used between SiP module 196 and PCB 502.

Semiconductor die 104 are electrically coupled to conductive layer 504 through bumps 114, substrate 150, and bumps 190. Discrete devices 162 are coupled to conductive layer 504 through solder paste 166, substrate 150, and bumps 190. In some embodiments, substrate 150 couples semiconductor die 104 and discrete devices 162 to each other. In other embodiments, conductive layer 504 couples semiconductor die 104 and discrete devices 162 to each other. Semiconductor die 104 and discrete devices 162 are coupled to discrete device 174 through conductive layer 504 if desired for the electronic device.

FIG. 10b illustrates electronic device 505 including PCB 502 with a plurality of semiconductor packages mounted on a surface of the PCB, including SiP module 196. Electronic device 505 can have one type of semiconductor package, or multiple types of semiconductor packages, depending on the application.

Electronic device 505 can be a stand-alone system that uses the semiconductor packages to perform one or more electrical functions. Alternatively, electronic device 505 can be a subcomponent of a larger system. For example, electronic device 505 can be part of a tablet computer, cellular phone, digital camera, communication system, or other electronic device. Electronic device 505 can also be a graphics card, network interface card, or other signal processing card that is inserted into a computer. The semiconductor packages can include microprocessors, memories, ASICs, logic circuits, analog circuits, RF circuits, discrete active or passive devices, or other semiconductor die or electrical components.

In FIG. 10b, PCB 502 provides a general substrate for structural support and electrical interconnection of the semiconductor packages mounted on the PCB. Conductive signal traces 504 are formed over a surface or within layers of PCB 502 using evaporation, electrolytic plating, electroless plating, screen printing, or other suitable metal deposition process. Signal traces 504 provide for electrical communication between each of the semiconductor packages, mounted components, and other external systems or components. Traces 504 also provide power and ground connections to each of the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 502. In other embodiments, a semiconductor device may only have the first level packaging where the die is mechanically and electrically mounted directly to PCB 502.

For the purpose of illustration, several types of first level packaging, including bond wire package 506 and flipchip 508, are shown on PCB 502. Additionally, several types of second level packaging, including ball grid array (BGA) 510, bump chip carrier (BCC) 512, land grid array (LGA) 516, multi-chip module (MCM) 518, quad flat non-leaded package (QFN) 520, embedded wafer level ball grid array (eWLB) 524, and wafer level chip scale package (WLCSP) 526 are shown mounted on PCB 502 along with SiP module 196. In one embodiment, eWLB 524 is a fan-out wafer level package (Fo-WLP) and WLCSP 526 is a fan-in wafer level package (Fi-WLP). Conductive traces 504 electrically couple the various packages disposed on substrate 502 to semiconductor die 104, discrete devices 162, and discrete devices 174 of SiP module 196.

Depending upon the system requirements, any combination of semiconductor packages, configured with any combination of first and second level packaging styles, as well as other electronic components, can be connected to PCB 502. In some embodiments, electronic device 505 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate including a first opening formed in the substrate;
   a first semiconductor component disposed on the substrate;
   a discrete inductor comprising a first solder bump disposed in the first opening of the substrate;
   an encapsulant deposited over the substrate, first semiconductor component, and discrete inductor, wherein the encapsulant contacts the first solder bump and the first solder bump is exposed from the encapsulant; and
   a second solder bump disposed on the first solder bump outside the encapsulant.

2. The semiconductor device of claim 1, further including:
   a second opening formed in the substrate; and
   a second semiconductor component disposed in the second opening.

3. The semiconductor device of claim 2, wherein the second semiconductor component is a semiconductor package.

4. The semiconductor device of claim 3, further including a first shielding layer formed over the semiconductor package, wherein the encapsulant is deposited over the first shielding layer.

5. The semiconductor device of claim 4, further including a second shielding layer formed over the encapsulant, wherein the second shielding layer contacts a side surface of the substrate and the side surface of the substrate is perpendicular to the bottom surface of the substrate.

6. The semiconductor device of claim 1, wherein a distance from a top surface of the encapsulant to a top surface of the substrate is less than a height of the discrete inductor.

7. A semiconductor device, comprising:
   a substrate including an opening formed in the substrate;
   a first semiconductor component disposed in the opening of the substrate, wherein the first semiconductor component includes a first solder bump;
   an encapsulant deposited over the substrate and first semiconductor component, wherein the encapsulant contacts and surrounds the first solder bump; and
   a second solder bump disposed on the first solder bump outside the encapsulant.

8. The semiconductor device of claim 7, further including:
   a second opening formed in the substrate; and
   an electrical component disposed in the second opening.

9. The semiconductor device of claim 7, further including a shielding layer formed over the encapsulant.

10. The semiconductor device of claim 9, further including:
    a second opening formed in the substrate; and
    a semiconductor package disposed in the second opening.

11. The semiconductor device of claim 10, further including a second shielding layer formed over the semiconductor package.

12. A semiconductor device, comprising:
    a substrate including a first opening formed in the substrate;

a first semiconductor component disposed on the substrate;

a second semiconductor component disposed in the first opening of the substrate, wherein the second semiconductor component includes an interconnect structure, and wherein the interconnect structure is a contact pad or solder bump; and an encapsulant disposed over the substrate, first semiconductor component, and second semiconductor component, wherein the encapsulant contacts and surrounds the interconnect structure while the interconnect structure remains exposed from the encapsulant.

13. The semiconductor device of claim 12, wherein a distance from a top surface of the encapsulant to a top surface of the first substrate is less than a height of the second semiconductor component.

14. The semiconductor device of claim 12, further including a shielding layer disposed over the encapsulant.

15. The semiconductor device of claim 12, wherein the second semiconductor component is a semiconductor package.

16. The semiconductor device of claim 12, further including a third semiconductor component, wherein the first substrate further includes a second opening with the third semiconductor component disposed in the second opening.

17. The semiconductor device of claim 12, further including a third semiconductor component disposed in the first opening.

18. A semiconductor device, comprising:
a substrate;
a first semiconductor component disposed over the substrate; and
a second semiconductor component disposed adjacent to the substrate, wherein the second semiconductor component includes a solder bump or contact pad; and
an encapsulant deposited over the substrate and contacting the solder bump or contact pad, wherein the solder bump or contact pad remains exposed from the encapsulant.

19. The semiconductor device of claim 18, wherein a height of the second semiconductor component is greater than a height of the first semiconductor component.

20. The semiconductor device of claim 18, further including a semiconductor package disposed adjacent to the substrate.

21. The semiconductor device of claim 20, further including a shielding layer formed over the semiconductor package.

22. The semiconductor device of claim 18, wherein the second semiconductor component is disposed within an opening of the substrate.

23. The semiconductor device of claim 18, further including a tape laminated on the substrate opposite the first semiconductor component, wherein the second semiconductor component is disposed on the tape.

* * * * *